(12) United States Patent
Bonart et al.

(10) Patent No.: US 6,797,562 B2
(45) Date of Patent: Sep. 28, 2004

(54) METHOD FOR MANUFACTURING A BURIED STRAP CONTACT IN A MEMORY CELL

(75) Inventors: Dietrich Bonart, Bad Abbach (DE); Gerhard Enders, Olching (DE); Bjoern Fischer, Munich (DE); Peter Voigt, Hallbergmoos (DE)

(73) Assignee: Infineon Technologies AG, Münich (DE)

( * ) Notice: Subject to any disclaimer, the term of this patent is extended or adjusted under 35 U.S.C. 154(b) by 0 days.

(21) Appl. No.: 10/607,033

(22) Filed: Jun. 26, 2003

(65) Prior Publication Data

US 2004/0048436 A1 Mar. 11, 2004

(30) Foreign Application Priority Data

Jun. 26, 2002 (DE) ......................... 102 28 547

(51) Int. Cl.$^7$ ........................... H01L 21/8242
(52) U.S. Cl. ........................ 438/243
(58) Field of Search ......................... 438/243

(56) References Cited

U.S. PATENT DOCUMENTS

| 5,310,698 | A | | 5/1994 | Wild | |
|---|---|---|---|---|---|
| 6,063,658 | A | * | 5/2000 | Horak et al. | 438/248 |
| 6,068,928 | A | | 5/2000 | Schrems et al. | |
| 6,329,703 | B1 | * | 12/2001 | Schrems et al. | 257/636 |
| 6,451,648 | B1 | * | 9/2002 | Gruening et al. | 438/243 |
| 6,509,599 | B1 | * | 1/2003 | Wurster et al. | 257/301 |
| 6,548,850 | B1 | * | 4/2003 | Gernhard et al. | 257/301 |
| 2002/0163842 | A1 | * | 11/2002 | Benzinger et al. | 365/200 |

FOREIGN PATENT DOCUMENTS

| EP | 0 491 976 | 12/1990 |
|---|---|---|
| EP | 0 971 414 | 6/1998 |
| EP | 0 939 435 | 11/1998 |
| EP | 0 939 430 | 12/1998 |

* cited by examiner

*Primary Examiner*—David Nelms
*Assistant Examiner*—Thao P. Le
(74) *Attorney, Agent, or Firm*—Schiff Hardin LLP

(57) ABSTRACT

A method is provided for manufacturing a buried strap contact between a transistor and a trench capacitor in a memory cell, particularly a DRAM memory cell. In this method, the two spacers of the gate electrode lying opposite one another and the gate path applied on the trench insulation of the memory cell serve as part of the mask that is employed for etching the contact trench and in which the buried bridge of the trench capacitor is subsequently generated. As a result, the position of that sidewall of the bridge facing toward the gate electrode is generated in self-aligning fashion relative to the gate electrode. This avoids photolithographic tolerances in the positioning of the bridge relative to the gate electrode.

13 Claims, 2 Drawing Sheets

METHOD FOR MANUFACTURING A BURIED STRAP CONTACT IN A MEMORY CELL

BACKGROUND OF THE INVENTION

1. Field of the Invention

The present invention is directed to a method for manufacturing a buried strap contact between a transistor and a trench capacitor in a memory cell, particularly a DRAM memory cell.

2. Description of the Related Art

Memory cells with trench capacitors are utilized in integrated circuits (ICs) such as random-access memories (RAMs), dynamic RAMs (DRAMs) and synchronous DRAMs (SDRAMs). The ICs typically employ capacitors for the purpose of charge storage. In dynamic write/read memories with random access (DRAMs), for example, the charge status of the capacitor is thus used for the representation of a data bit.

Over and above this, a DRAM memory cell also comprises a "selection transistor" that is electrically conductively connected to the capacitor. Typically, the selection transistor is a MOS transistor, i.e., it comprises a source region and a drain region that are separated from one another by a channel zone. A gate electrode is arranged over the channel zone via which the flow of current in the channel can be controlled. For driving the memory cell, one of the source/drain regions (S/D regions) is connected to the bit line, and the gate electrode is connected to the word line of the memory. The other S/D region is connected to the capacitor.

The continued striving for miniaturization of the memory devices requires the design of DRAMs with a higher density and smaller characteristic quantity, i.e., a smaller memory cell area. This could be enabled by employing smaller components, i.e., smaller capacitors. Due to a miniaturization of the capacitors, however, their storage capacity is also reduced, which has a negative influence on the function of the memory cell: first, the required dependability in the readout of the stored value can no longer be guaranteed; and second, the refresh frequency in DRAMs must be increased.

One solution of this problem is offered by the trench capacitor, where the capacitor area is vertically arranged in a trench in the substrate. This arrangement allows a relatively large capacitor area, i.e., an adequately large capacity, given a simultaneously slight surface requirement. For manufacturing a trench capacitor, a trench is first etched into a substrate. For forming the first capacitor electrode, for example, a dopant is then introduced into the substrate material surrounding the trench wall. The trench wall is then lined with a dielectric, whereby ONO is employed, for example, as dielectric. The trench is subsequently filled up with an electrically conductive filler material. Preferably, an insulator collar that prevents a leakage current to the first electrode is formed in an upper region of the trench insulator. Methods for manufacturing trench capacitors are disclosed, for example, by European Patent Documents EP 0 491 976 B1 and EP 0 971 414 A1.

For manufacturing a memory cell, the capacitor must ultimately also be connected to an S/D region of the transistor, which can occur, for example, via a strap contact. The strap contact is typically fashioned as a buried strap contact ("buried strap"), i.e., the contact is produced under the upper substrate surface, since this arrangement has the advantage that it requires less area than a strap contact lying at the surface. A buried strap contact thus facilitates a miniaturization of the memory cell.

In the manufacture of such a buried strap contact, a bridge is generated on the filler material of the second electrode in the trench, this bridge being typically composed of polysilicon and representing a part of the strap contact. A doped diffusion region that extends up to an S/D region of the transistor is fashioned in that region of the monocrystalline silicon adjacent to the bridge. Together, the diffusion region and the bridge form the strap contact that produces an electrically conductive connection between the second capacitor electrode and the S/D region of the transistor. Methods for manufacturing such buried strap contacts are disclosed, for example, by European Patent Documents EP 0 939 430 A2, EP 0 939 435 A1 and EP 0 971 414 A1.

As mentioned above, highly doped polysilicon is typically employed for the electrically conductive filler material. For example, As is suitable as dopant, this being introduced into the polysilicon in a concentration of $10^{19}$ through $10^{20}$ cm$^{-3}$. On the basis of a temperature-controlled diffusion step, the dopant can diffuse from the filler material into the polysilicon of the bridge and from the latter into the adjacent monocrystalline silicon of the substrate and thus form a diffusion zone that has an adequately high electrical conductivity and produces the electrical contact between the capacitor and the transistor.

So that a satisfactory contact is produced between the trench capacitor and the transistor, it is necessary that the diffusion zone is generated in an exactly defined region between the bridge and the gate electrode. After the diffusion zone and the bridge have been structured in the substrate, the gate electrode is usually generated on the substrate via a photolithographic process for this purpose. I.e., after the deposition of the layers forming the gate stack, a photoresist layer is deposited on the layers, exposed through a mask, and subsequently developed. The gate electrode is then structured via an appropriate etching.

This type of positioning of the gate electrode relative to the diffusion zone and the bridge, however, is affected by pronounced positional tolerances, which can lead to too great an overlap between the diffusion zone and the gate electrode and, thus, to great fluctuations in the effective channel length of the selection transistor, as a result of which its function can be degraded.

SUMMARY OF THE INVENTION

It is therefore an object of the present invention to provide an efficient and effective method for the manufacture of a buried strap contact between a transistor and a trench capacitor in a memory cell, particularly a DRAM memory cell. A further object of the present invention is to provide an efficient and effective manufacturing method that can be easily integrated into an existing manufacturing process. Over and above this, an object of the present invention is to provide an efficient and effective manufacturing method that allows a miniaturization of the memory cell without negatively influencing the performance of the memory cell.

Inventively, a method for manufacturing a buried strap contact between a transistor and a trench capacitor in a memory cell, particularly a DRAM memory cell, is provided that comprises:

a) a trench capacitor is generated in a substrate, the trench capacitor comprising a lower region filled with a first doped filler material having a first width and comprising an open, unfilled region adjacent thereto, whereby the unfilled region comprises sidewalls and a floor formed by the first, doped filler material;

b) the unfilled region of the trench capacitor is filled with essentially monocrystalline silicon;

c) gate paths are generated on the substrate surface;

d) for generating the buried strap contact, a contact trench having a second width is etched at least down to the depth of the floor formed by the first doped filler material, whereby the gate paths form at least part of the mask utilized for etching the contact trench;

e) a second filler material is deposited in the contact trench for forming a buried bridge as part of the buried strap contact, whereby the buried bridge is in direct contact with the first doped filler material; and f) at least one thermal treatment is implemented in order to generate a diffusion region as part of the buried strap contact.

The inventive method makes it possible to generate the diffusion region, which produces the contact between the trench capacitor and the selection transistor, with a higher positional precision and without an additional photolithographic step. Accordingly, the process stability is enhanced and, thus, a better yield is achieved in the overall process of the memory cell manufacture. The spacing between gate electrode and bridge is exactly defined in that the gate paths, particularly the gate path of the selection transistor of the memory cell, form at least a part of the mask for the definition of the bridge of the strap contact. Accordingly, the diffusion region to be generated via the thermal treatment and the effective channel length of the transistor can be precisely set in a simple way.

DESCRIPTION OF THE DRAWINGS

Advantageous embodiments of the present invention are explained below on the basis of the attached drawings.

DETAILED DESCRIPTION OF THE PREFERRED EMBODIMENTS

Figure 1A:
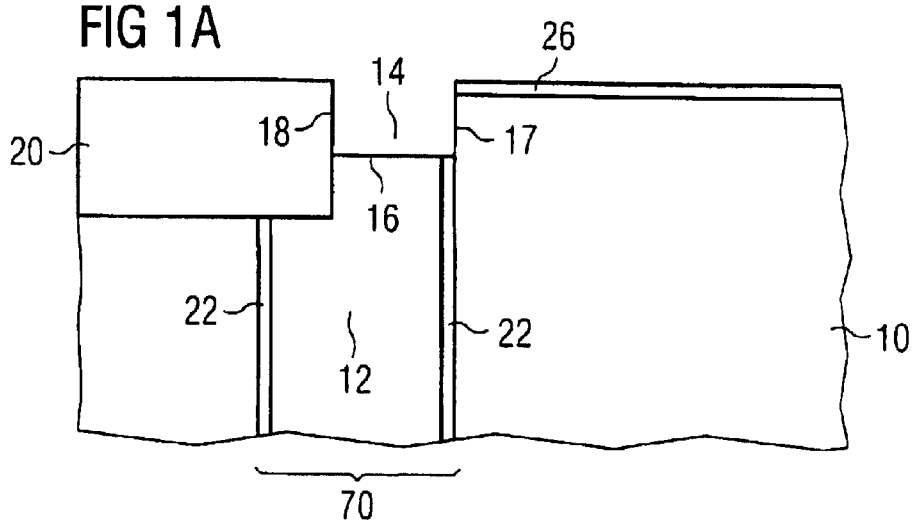
FIG. 1A is a side cutout view of the device after the formation of the lower filled region of the trench has been filled.

The gate paths comprise lateral spacers in a preferred embodiment of the inventive method. For structuring the spacers of the gate paths or gate electrodes, for example, a layer of an appropriate material can be deposited on the surface of the substrate on which the gate paths were pre-structured and can be selectively removed from the substrate surface by a subsequent anisotropic etching such that only the sidewalls of the gate paths remain covered by the previously deposited material.

In another preferred embodiment of the inventive method, the unfilled region of the trench capacitor is filled with monocrystalline silicon in step b) using an epitaxial deposition method, preferably a CVD deposition method. Traditional methods that, for example, employ $SiH_2Cl_2$ or $SiH_4$ as an initial reaction gas and that are usually implemented at temperatures between 900 and 1250° C. can be utilized for this.

In another preferred embodiment of the present invention, a first insulation layer is applied on the floor of the open, unfilled region before step b). In an especially preferred version of the inventive method, the first insulation layer is a silicon dioxide layer. However, any other material can be employed that represents an effective diffusion barrier for the dopants contained in the first filler material. For example, silicon nitride or silicon oxide nitride can also be employed.

Preferably, these layers can be selectively deposited onto the floor of the open, unfilled region using anisotropic high density plasma (HDP) deposition methods. A further possibility for generating a silicon oxide layer on the floor of the open, unfilled region is to deposit a thin silicon oxide layer both on the floor as well as on the sidewalls in a first step. Subsequently, a thin polysilicon layer is first deposited over the thin silicon oxide layer and a thin silicon nitride layer is then deposited. The silicon nitride layer is subsequently removed from the floor by anisotropic etching; however, it remains on the sidewalls. The polysilicon that is exposed at the floor after this etching is then oxidized to silicon oxide via an oxidation step. Subsequently, the silicon nitride, the polysilicon lying under it, as well as the thin silicon oxide layer are removed from the sidewalls, so that only the floor of the open, unfilled region is covered with a silicon oxide layer.

In that the insulation layer is deposited only on the floor of the open, unfilled region, the unfilled region of the trench capacitor can be filled via one of the previously mentioned epitaxial deposition methods in the following step b).

A drive-out of dopants from the lower, filled region of the trench capacitor into the regions lying above the insulation layer is prevented by the insulation layer. The employment of the first insulation layer makes it possible that the second width of the contact trench can be less than the first width of the filled region of the trench capacitor.

In an especially preferred version of the inventive method, accordingly, the second width of the contact trench is lower than the first width of the filled region of the trench capacitor. As a result of the different widths of the lower, filled region of the trench capacitor and of the contact trench or the buried bridge formed from this, the finished capacitor comprises a step at the lower end of the buried bridge, this step being covered by the first insulation layer. The first insulation layer thus prevents a horizontal drive-out of the dopants into the regions of the substrate placed above the step. As a result of the finished buried bridge comprising a lower width than the trench capacitor, the spacing between the selection transistor and the trench capacitor can be additionally diminished and, thus, a lateral space saving can be achieved for the memory cell formed of trench capacitor and transistor. A higher integration density on the substrate can thus be realized overall by this method.

In a further, especially preferred version of the inventive method, the first doped filler material is polysilicon doped with a dopant. Arsenic or phosphorous is preferably employed as a dopant for the first filler material, preferably in a dopant concentration of from $10^{19}$ to $10^{20}$ cm$^{-3}$.

In a preferred version of the inventive method, polysilicon is employed as second filler material. The filler materials can thereby be deposited and, as warranted, doped by using traditional methods.

FIG. 1A schematically shows the upper region of a partially structured trench capacitor 70 in a substrate 10. The substrate 10 is composed of monocrystalline silicon here; however, other substrate materials that are standard in semiconductor technology can also be employed. The trench capacitor 70 shown in FIG. 1A comprises a lower, filled region 12 that may be filled with doped polysilicon as first filler material. In the finished trench capacitor 70, the filled region 12 forms the inner capacitor electrode. In the upper region of the trench capacitor, the filled region can be insulated from the substrate 10 by a insulator collar 22.

The insulator collar 22 can, for example, be constructed of a thermal oxide layer and of a TEOS layer applied thereon. The insulator collar 22 prevents or at least reduces the occurrence of leakage currents between the contact region of the trench capacitor 70 and the outer capacitor electrode (not shown). The outer capacitor electrode can be generated by introducing dopant in a region of the substrate 10 adjacent to the trench wall. Subsequently, a dielectric, for example ONO, may be deposited onto the trench wall, where materials having a high dielectric constant are preferred here. Subsequently, the first filler material is deposited and, thus, the lower filled region 12 of the trench capacitor is formed.

The lower, filled region 12 of the trench capacitor is adjoined by the open, unfilled region 14. This region 14 comprises the floor 16 formed by the first filler material as well as the sidewall 18 formed by the trench insulation (shallow trench insulation (STI)) and the sidewall facing toward the gate electrode. The trench insulation 20 can, for example, comprise a depth of 0.25 μm and serve the purpose of isolating the finished memory cell from neighboring cells. That region of the substrate 10 adjoining the unfilled region 14 may comprise an upper oxide layer 26.

Figure 1B:
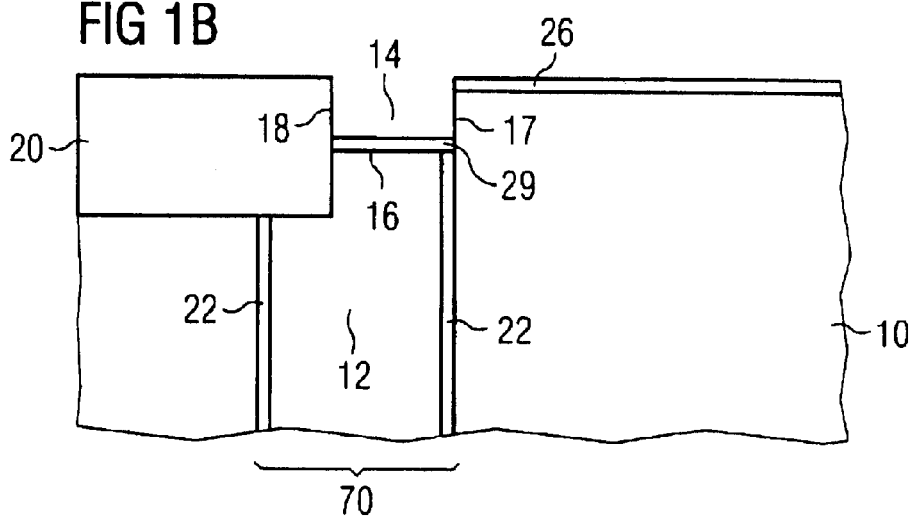
FIG. 1B is a side view of the device after an oxide layer has been provided on the lower filled region.

As shown in FIG. 1B, an oxide layer 29 may be subsequently deposited on the floor 16 of the unfilled region 14 such that only the floor is covered but the sidewalls 17 and 18 remain uncovered. The oxide layer may be deposited on the floor 16 using an anisotropic HDP deposition method in the present case.

Figure 1C:
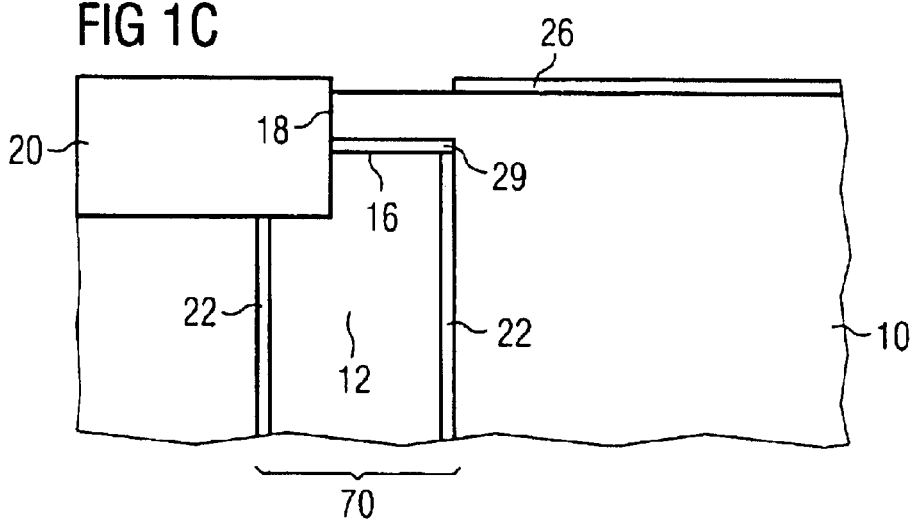
FIG. 1C is a side view of the device after the unfilled region is filled.

As shown idealized in FIG. 1C, the unfilled region 14 may subsequently be filled with monocrystalline silicon using an epitaxial CVD deposition method. Upon employment of traditional methods, the storage transistor as well as a gate path 41 arranged above the trench insulation 20 may subsequently be produced. The storage transistor may comprise the gate oxide layer 36 applied on the substrate 10, the source/drain regions 51 and 52, as well as the gate path or gate electrode 31. The source/drain regions are separated via the channel zone 53. The gate electrode may comprise a first gate electrode sidewall 32 facing toward the trench capacitor as well as a second gate electrode sidewall 33.

Figure 1D:
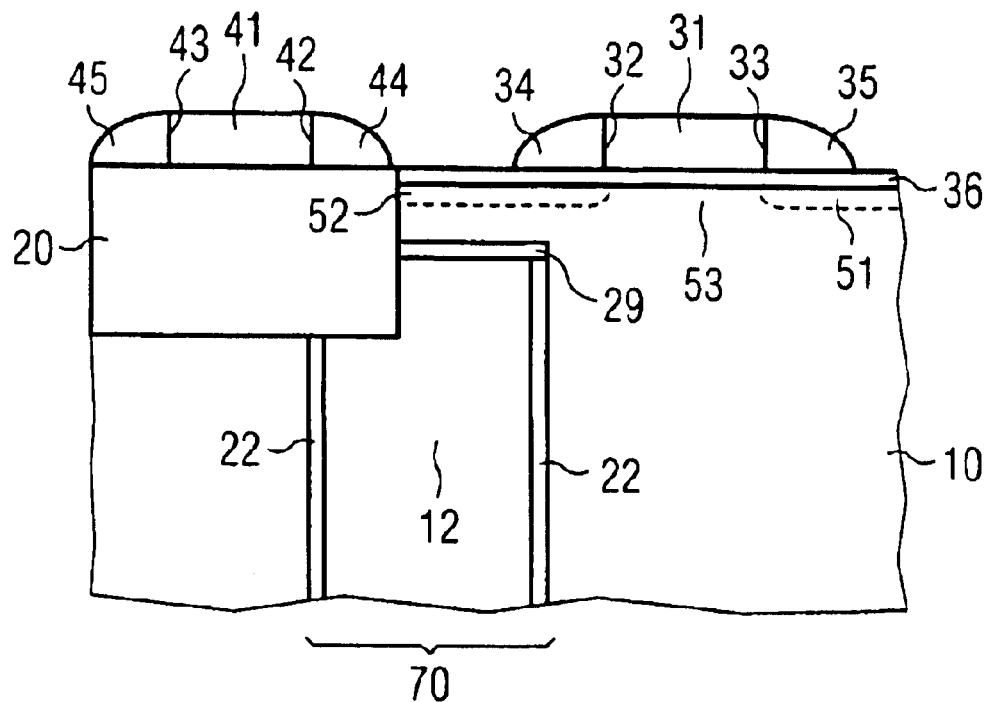
FIG. 1D is a side view of the device after electrodes and bounding regions have been provided.

The gate path may comprise a first gate path sidewall 42 facing toward the trench capacitor and a second gate path sidewall 43 facing away from the trench capacitor. The spacers 34, 35 or 44, 45 can be applied to the respective sidewalls of the gate electrode 31 or of the gate path 41 (FIG. 1D).

After the gate electrode 31 and the gate path 41 together with their respective spacers 34, 35 or 44, 45 have been structured, a buried bridge 61 may be structured. To that end, the contact trench 60 can be etched into the monocrystalline polysilicon that was deposited in the unfilled region 14. This may occur via an anisotropic etching in which the gate electrode 31 and the appertaining spacers 34 and 35 as well as the gate path 41 with its spacers 44 and 45 can serve as a mask for the etching of the contact trench 60. The mask can comprise further component parts that, for example, cover the regions of the substrate adjoining the outer spacers 35 or 45. These component parts can be formed, for example, using a photolithographic mask or with other auxiliary layers that can in turn be removed as warranted during the further course of the method.

The contact trench 60 may be etched at least down to the depth of the floor 16 in order to thus assure that an adequate contact is guaranteed between the inner capacitor electrode 12 and the buried bridge 61. I.e., that a part of the oxide layer 29 may also be removed in the anisotropic etching of the contact trench 60. This can potentially be achieved using a variation of the etching conditions.

Figure 1E:
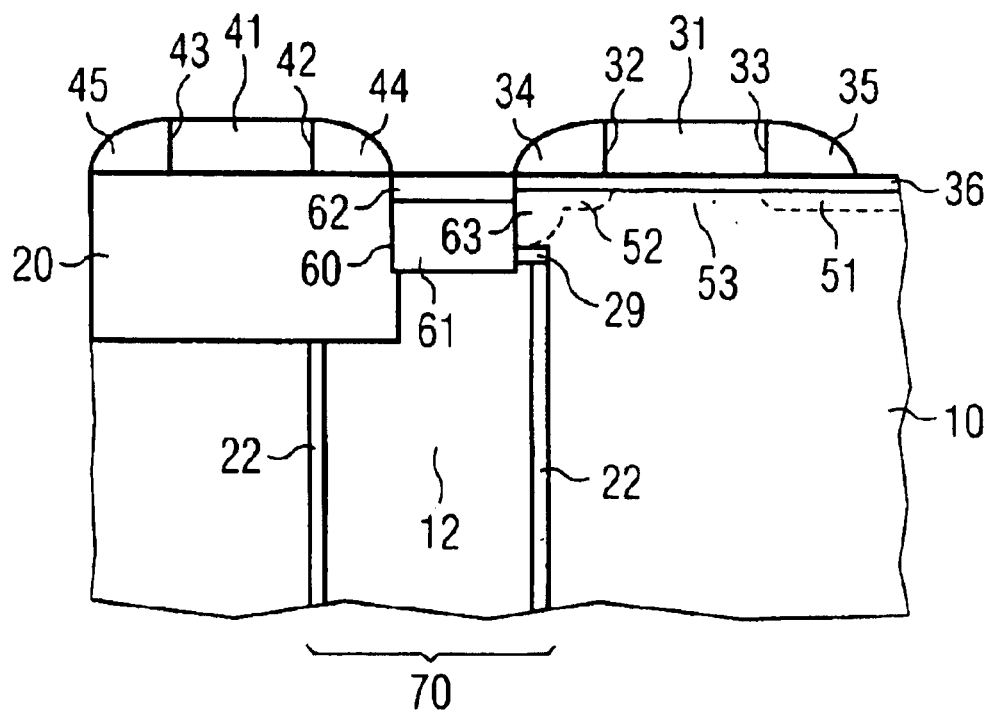
FIG. 1E is a side view of the device after the diffusion portion has been added.

In the embodiment of the method shown in FIG. 1E, the width of the contact trench 60 may be selected smaller than the width of the inner capacitor electrode 12. A part of the oxide layer 29 as well as of the region of the inner capacitor electrode 12 immediately adjacent to it thus remain in place after the etching and form a step. The remaining region of the oxide layer 29 can prevent a horizontal drive-out of dopants from the capacitor electrode 12 into the region of the substrate 10 placed above the step. The oxide layer 29 thus makes it possible that the width of the contact trench can be smaller than the width of the inner capacitor electrode 12. A lateral space saving in the memory cell layout is achieved as a result.

After the etching of the contact trench 60, this may be filled with polysilicon for forming the buried bridge 61 and may subsequently be insulated toward the top using the second oxide layer 62. As a final step, the diffusion region 63 may be generated using a thermal treatment and, thus, the buried strap contact is completed. As a result of the thermal treatment, the dopant contained in the inner contact electrode 12 can diffuse out through the polysilicon of the buried bridge 61 via the sidewall of the buried bridge 61 facing toward the trench electrode and into the adjoining substrate 10 and thus form the diffusion region 63 that produces the conductive contact between the source/drain region 52 and the inner capacitor electrode 12.

In that the gate paths 31 and 41 together with their respective spacers 34 and 44 serve as mask in the etching of the contact trench 60, the position of that sidewall of the buried bridge facing toward the gate electrode is generated in a self-aligning fashion relative to the gate electrode 31. Tolerances in the positions of the two elements of the memory cell relative to one another caused by photolithographic processes are thus avoided.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The particular implementations shown and described herein are illustrative examples of the invention and are not intended to otherwise limit the scope of the invention in any way. For the sake of brevity, conventional structural and other functional aspects of the system and method may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A method for manufacturing a buried strap contact between a transistor and a trench capacitor in a memory cell, comprising:

a) generating a trench capacitor in a substrate, the trench capacitor comprising a lower region filled with a first doped filler material having a first width and comprising an open, unfilled region adjacent to it, the unfilled region comprising sidewalls and a floor formed by the first doped filler material;

b) filling the unfilled region of the trench capacitor with essentially monocrystalline silicon;

c) generating gate paths on the substrate surface;

d) etching, for generating a buried strap contact, a contact trench having a second width at least down to a depth of the floor formed by the first doped filler material, the gate paths forming at least part of a mask utilized for etching the contact trench;

e) depositing a second filler material in the contact trench for forming a buried bridge as part of the buried strap contact, the buried bridge being in direct contact with the first doped filler material; and f) providing at least one thermal treatment in order to generate a diffusion region as part of the buried strap contact.

2. The method according to claim 1, wherein the memory cell is a DRAM memory cell.

3. The method according to claim 1, further comprising: applying a first insulation layer on the floor of the opened, unfilled region before stage b).

4. The method according to claim 3, wherein the first insulation layer is a silicon oxide layer.

5. The method according to claim 1, wherein the second width of the contact trench is less than the first width of the filled region of the trench capacitor.

6. The method according to claim 1, wherein the first doped filler material is polysilicon with a dopant.

7. The method according to claim 6, further comprising providing As or P as a dopant, preferably in a dopant concentration of $10^{19}$ through $10^{20}$ cm$^{-1}$.

8. The method according to claim 1, further comprising providing the dopant in a concentration of $10^{19}$ through $10^{20}$ cm$^{-1}$.

9. The method according to claim 1, further comprising providing polysilicon as second filler material.

10. The method according to claim 1, further comprising providing lateral spacers for the gate paths.

11. The method according to claim 1, further comprising filling the unfilled region of the trench capacitor with monocrystalline silicon in stage b) utilizing an epitaxial deposition method.

12. The method according to claim 11, wherein the epitaxial deposition method is a CVD method.

13. The method according to claim 1, wherein the substrate comprises a trench insulation that forms at least one sidewall of the open, unfilled region of the trench capacitor.

* * * * *